(12) United States Patent
Kim et al.

(10) Patent No.: US 10,627,438 B2
(45) Date of Patent: Apr. 21, 2020

(54) CIRCUIT FAULT DETECTION SYSTEM AND CONTROL METHOD THEREOF

(71) Applicant: Mando-Hella Electronics Corporation, Incheon (KR)

(72) Inventors: Ki-Man Jackie Kim, Gyeonggi-do (KR); Hyun-Ho Jang, Incheon (KR); Jae-Bong Jung, Incheon (KR)

(73) Assignee: MANDO-HELLA ELECTRONICS CORPORATION, Incheon (KR)

( * ) Notice: Subject to any disclaimer, the term of this patent is extended or adjusted under 35 U.S.C. 154(b) by 244 days.

(21) Appl. No.: 15/385,866

(22) Filed: Dec. 21, 2016

(65) Prior Publication Data

US 2017/0184652 A1 Jun. 29, 2017

(30) Foreign Application Priority Data

Dec. 23, 2015 (KR) ........................ 10-2015-0184926

(51) Int. Cl.
*G01R 31/02* (2006.01)
*G01R 31/00* (2006.01)

(52) U.S. Cl.
CPC ......... *G01R 31/025* (2013.01); *G01R 31/007* (2013.01)

(58) Field of Classification Search
CPC .................................................... G01R 31/002
(Continued)

(56) References Cited

U.S. PATENT DOCUMENTS 3,546,581 A * 12/1970 Halverson ............ G01R 27/025
324/515
2007/0070384 A1* 3/2007 Jeon .................... H04N 1/00885
358/1.14
(Continued)

FOREIGN PATENT DOCUMENTS

EP 1 437 600 7/2004
EP 2 801 837 11/2014
(Continued)

OTHER PUBLICATIONS maxim integrated, Reverse-Current Circuitry Protection, https://pdfserv.maximintegrated.com/en/an/AN636.pdf (Jan. 31, 2001; last visited Nov. 19, 2018, 5:46 PM). (Year: 2001).*

(Continued)

*Primary Examiner* — Tung X Nguyen
*Assistant Examiner* — Robert P Alejnikov, Jr.
(74) *Attorney, Agent, or Firm* — Ladas & Parry, LLP (57) ABSTRACT

Disclosed are a circuit fault detection system and method for a circuit fault detection. A circuit fault detection system includes: a detection circuit including a diode, a first resistor, and a second resistor, positioned between an applied voltage source and a top of a detection target circuit in series, and a third resistor and a fourth resistor, positioned between the detection target circuit and a ground in series, an input unit including a first input terminal receiving a voltage measured between the first resistor and the second resistor, and a second input terminal receiving a voltage measured between the third resistor and the fourth resistor, a controller detecting a failure in the detection target circuit and in an operation of the detection target circuit based on values of the voltages detected by the input unit; and a display unit providing a warning to a user when the failure is detected.

7 Claims, 5 Drawing Sheets

(58) Field of Classification Search
USPC .......................................................... 324/537
See application file for complete search history.

(56) References Cited

U.S. PATENT DOCUMENTS

| | | | |
|---|---|---|---|
| 2012/0074978 A1* | 3/2012 | Gentrup | G01R 29/0814 324/754.19 |
| 2013/0185008 A1* | 7/2013 | Itabashi | H01M 10/486 702/63 |
| 2013/0271215 A1* | 10/2013 | Lang | H03F 3/2171 330/251 |

FOREIGN PATENT DOCUMENTS

| | | |
|---|---|---|
| FR | 3 010 585 | 3/2015 |
| KR | 1996-0018596 | 6/1996 |
| KR | 1999-0074086 | 10/1999 |
| KR | 10-2004-0001071 | 1/2004 |
| KR | 10-1469435 | 12/2014 |
| KR | 101469435 B1 * | 12/2014 |

OTHER PUBLICATIONS

Notice of Allowance dated May 19, 2017 for Korean Patent Application No. 10-2015-0184926 and its English translation provided by Applicant's foreign counsel.

Office Action dated Dec. 15, 2016 for Korean Patent Application No. 10-2015-0184926 and its machine translation by the Google translate.

Preliminary Search Report dated Feb. 21, 2018 for French Application No. 1662946 and its English translation provided by Applicant's foreign council.

* cited by examiner

| ERROR CONDITIONS | FIRST INPUT UNIT | SECOND INPUT UNIT |
|---|---|---|
| OPEN CIRCUIT | $V2$ | $0$ |
| SHORT CIRCUIT TO BATTERY | $V1$ | $V1$ |
| SHORT CIRCUIT TO GROUND | $\frac{R2}{R1+R2} \cdot V2$ | $0$ |
| NORMAL | $\frac{R2+R3+R4}{R1+R2+R3+R4} \cdot V2$ | $\frac{R4}{R1+R2+R3+R4} \cdot V2$ |

FIG. 4

| FIRST INPUT UNIT | SECOND INPUT UNIT | $R_L$ | TOP CIRCUIT | BOTTOM CIRCUIT | ERROR TYPE |
|---|---|---|---|---|---|
| V2 | 0 | OPEN CIRCUIT | OPEN CIRCUIT/NORMAL | OPEN CIRCUIT/NORMAL | OPEN LOAD |
| V2 | 0 | OPEN CIRCUIT | OPEN CIRCUIT/NORMAL | SHORT CIRCUIT TO GROUND | OPEN LOAD |
| V2 | $\frac{R4}{R3+R4} \cdot V1$ | OPEN CIRCUIT | OPEN CIRCUIT/NORMAL | CONNECTION TO $V_1$ | OPEN LOAD OR SHORT TO $V_1$ BOTTOM SIDE |
| $\frac{R2}{R1+R2} \cdot V2$ | 0 | OPEN CIRCUIT | SHORT CIRCUIT TO GROUND | OPEN CIRCUIT/NORMAL | OPEN LOAD OR SHORT CIRCUIT TO GROUND (BOTTOM OR TOP SIDE) |
| $\frac{R2}{R1+R2} \cdot V2$ | 0 | OPEN CIRCUIT | SHORT CIRCUIT TO GROUND | SHORT CIRCUIT TO GROUND | OPEN LOAD OR SHORT CIRCUIT TO GROUND (BOTTOM OR TOP SIDE) |
| $\frac{R2}{R1+R2} \cdot V2$ | 0 | NORMAL | OPEN CIRCUIT/NORMAL | SHORT CIRCUIT TO GROUND | OPEN LOAD OR SHORT CIRCUIT TO GROUND (BOTTOM OR TOP SIDE) |
| $\frac{R2}{R1+R2} \cdot V2$ | 0 | NORMAL | SHORT CIRCUIT TO GROUND | OPEN CIRCUIT/NORMAL | OPEN LOAD OR SHORT CIRCUIT TO GROUND (BOTTOM OR TOP SIDE) |
| $\frac{R2}{R1+R2} \cdot V2$ | 0 | NORMAL | SHORT CIRCUIT TO GROUND | SHORT CIRCUIT TO GROUND | OPEN LOAD OR SHORT CIRCUIT TO GROUND (BOTTOM OR TOP SIDE) |
| $\frac{R2}{R1+R2} \cdot V2$ | $\frac{R4}{R3+R4} \cdot V1$ | OPEN CIRCUIT | SHORT CIRCUIT TO GROUND | CONNECTION TO $V_1$ | SHORT TO GROUND TOP SIDE OR SHORT TO $V_1$ LOW SIDE |
| $\frac{R2}{R1+R2} \cdot V2$ | $\frac{R4}{R3+R4} \cdot V1$ | NORMAL | SHORT CIRCUIT TO GROUND | CONNECTION TO $V_1$ | SHORT TO GROUND TOP SIDE OR SHORT TO $V_1$ LOW SIDE |
| $\frac{R2+R3+R4}{R1+R2+R3+R4} \cdot V2$ | $\frac{R4}{R1+R2+R3+R4} \cdot V2$ | NORMAL | OPEN CIRCUIT/NORMAL | OPEN CIRCUIT/NORMAL | NO ERROR |
| V1 | 0 | OPEN CIRCUIT | CONNECTION TO $V_1$ | OPEN CIRCUIT/NORMAL | SHORT TO $V_1$ TOP SIDE, OPEN LOAD OR SHORT TO GROUND BOTTOM SIDE |
| V1 | 0 | OPEN CIRCUIT | CONNECTION TO $V_1$ | SHORT CIRCUIT TO GROUND | SHORT TO $V_1$ TOP SIDE, OPEN LOAD OR SHORT TO GROUND BOTTOM SIDE |
| V1 | 0 | NORMAL | CONNECTION TO $V_1$ | SHORT CIRCUIT TO GROUND | SHORT TO $V_1$ TOP SIDE, OPEN LOAD OR SHORT TO GROUND BOTTOM SIDE |
| V1 | $\frac{R4}{R3+R4} \cdot V1$ | OPEN CIRCUIT | CONNECTION TO $V_1$ | CONNECTION TO $V_1$ | SHORT TO $V_1$ TOP SIDE |
| V1 | $\frac{R4}{R3+R4} \cdot V1$ | NORMAL | CONNECTION TO $V_1$ | CONNECTION TO $V_1$ | SHORT TO $V_1$ TOP SIDE |
| V1 | $\frac{R4}{R3+R4} \cdot V1$ | NORMAL | CONNECTION TO $V_1$ | OPEN CIRCUIT/NORMAL | SHORT TO $V_1$ TOP SIDE |
| $\frac{R1}{R1+R2} \cdot V1$ | $\frac{R4}{R3+R4} \cdot V1$ | NORMAL | OPEN CIRCUIT/NORMAL | CONNECTION TO $V_1$ | SHORT TO $V_1$ BOTTOM SIDE |

FIG. 5

CIRCUIT FAULT DETECTION SYSTEM AND CONTROL METHOD THEREOF

CROSS-REFERENCE TO RELATED APPLICATION

This application claims the benefit of Korean Patent Application No. 2015-0184926, filed on Dec. 23, 2015 in the Korean Intellectual Property Office, the disclosure of which is incorporated herein by reference.

BACKGROUND

1. Field

Embodiments of the present disclosure relate to a system for detecting an error that may occur in a circuit and a control method thereof.

2. Description of the Related Art

Generally, it is not easy for an integrated circuit (IC) system to detect errors therein.

For example, when an operating temperature in an IC or a power supply voltage significantly changes or a short circuit to ground, a power connection, or an open circuit phenomenon occurs in the circuit, a fault occurs.

Since a fault continuously occurs when a part in which a problem occurs is not quickly checked when the fault occurs, circuits used in a high-risk product family such as cars may result in property damage or human life damage due to such a fault.

In addition, research on a control method for detecting an error in a circuit at a low cost is, such as a case in which a circuit error detection system is ensured using a circuit diagram composed only of resistors which are passive elements except for diodes in order to detect a fault in a circuit, continuously progressing.

SUMMARY

According to an embodiment of the present invention, when circuit errors are detected, a circuit composed only of resistors which are passive elements except for diodes is used so that detection of circuit errors is achieved at a low cost.

In addition, the circuit fault detection system and method for circuit fault detection according to the embodiments can detect various malfunctions by assigning resistance values without overlapping voltage values of input nodes when conditions for possible errors are classified.

In addition, according to an embodiment of the present invention, a possibility of error occurrence is determined by expecting data regarding possible errors in stages, and data regarding an error which has occurred is obtained.

In addition, according to an embodiment of the present invention, when conditions for possible errors are classified, resistance values are assigned without overlapping voltage values of input nodes, so that various malfunctions are detected.

In accordance with one aspect of the present invention, a circuit fault detection system includes: a detection circuit including a diode, a first resistor, and a second resistor, which are positioned between an applied voltage source and a top of a detection target circuit in series, and a third resistor and a fourth resistor, which are positioned between the detection target circuit and a ground in series; an input unit including a first input terminal configured to receive a voltage measured between the first resistor and the second resistor as an input, and a second input terminal configured to receive a voltage measured between the third resistor and the fourth resistor as an input; a controller configured to detect a failure in the detection target circuit and in an operation of the detection target circuit based on values of the voltages detected by the input unit; and a display unit configured to provide a warning to a user when the failure is detected.

The first to fourth resistors of the detection circuit may have values greater than equivalent resistance values of the detection target circuit.

The controller may include error data that occurs in at least one of the detection target circuit or the operation of the detection target circuit based on the values of the voltages detected by the input unit.

The controller may control the error data to be displayed to the user when a failure which matches the error data is detected.

A failure that occurs in the detection target circuit may be one of an open circuit in the detection target circuit, a short circuit to battery, and a short circuit to ground.

In accordance with another aspect of the present invention, a circuit fault detection control method comprises: which a detection circuit including a diode, a first resistor, and a second resistor, which are positioned between an applied voltage source and a top of a detection target circuit in series, and a third resistor and a fourth resistor, which are positioned between the detection target circuit and a ground in series, measuring a first voltage between the first resistor and the second resistor; measuring a second voltage between the third resistor and the fourth resistor; detecting a failure in the detection target circuit and in an operation of the detection target circuit based on a value of the measured first voltage and a value of the measured second voltage; and providing a warning to a user when the failure is detected.

The failure in the detection target circuit may include an open circuit in the detection target circuit, a short circuit to battery, and a short circuit to ground.

The method may further comprise measuring a voltage value at a top of the detection target circuit and a voltage value at a bottom thereof in order to detect an error in the operation of the detection target circuit.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Hereinafter, embodiments of the present disclosure will be described in detail with reference to the accompanying drawings. The following embodiments are provided to fully convey the scope of present disclosure to those skilled in the art. The present disclosure is not limited to only the embodiments provided herein, and may be embodied in different forms. Parts irrelevant to description will be omitted in the drawings in order to clearly explain the present disclosure, and sizes of components may be slightly exaggerated to help understanding of the present disclosure.

Figure 1:
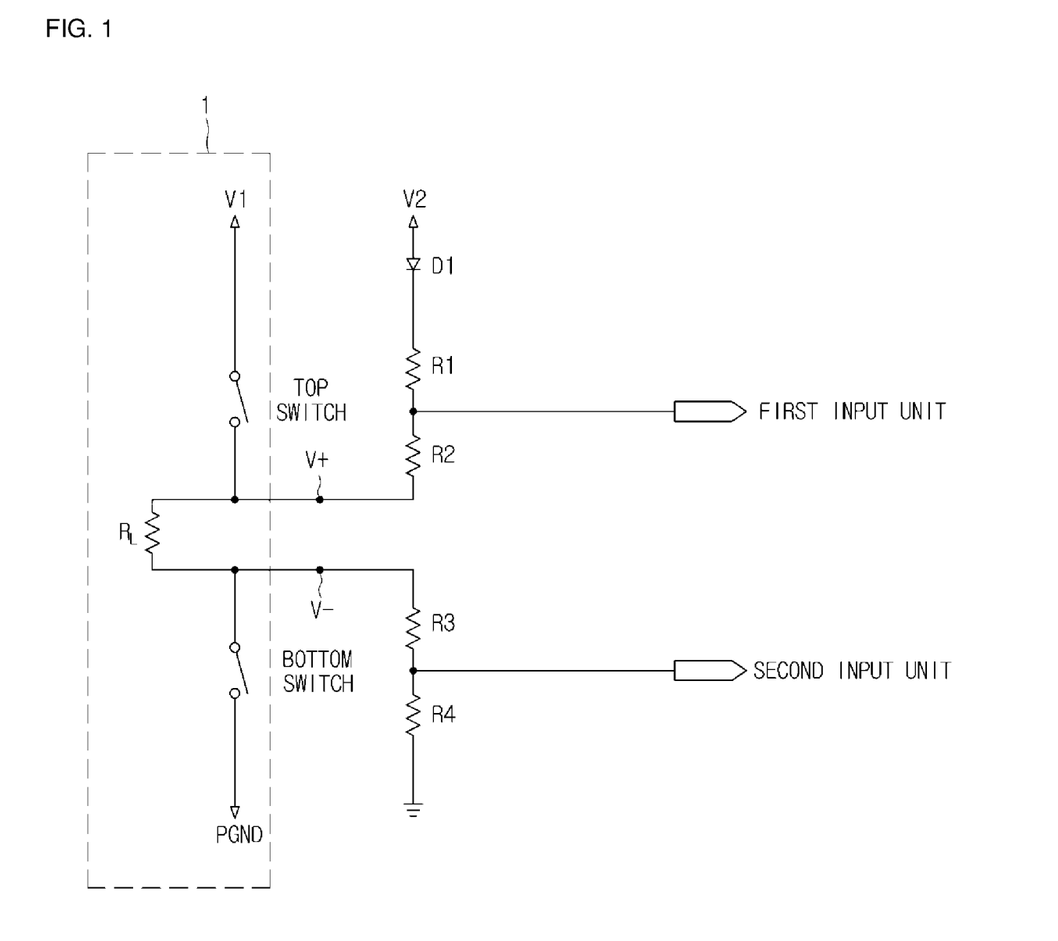
FIG. 1 is a schematic diagram illustrating a detection circuit for detecting a circuit fault according to one embodiment of the present disclosure.
Figure 2:
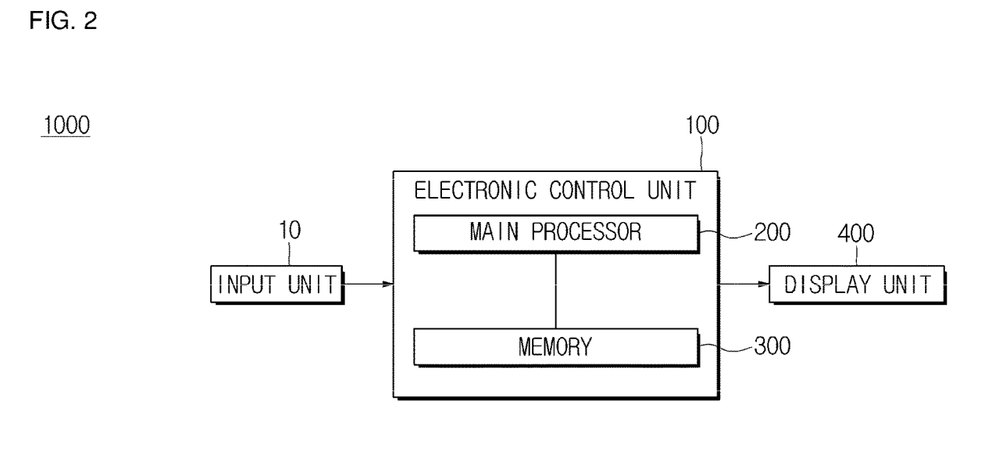
FIG. 2 is a block diagram of a circuit fault detection system.

First, FIG. 1 is a schematic diagram illustrating a detection circuit for detecting a circuit fault according to one embodiment of the present disclosure, and FIG. 2 is a block diagram of a circuit fault detection system including a first input unit and a second input unit of the detection circuit of FIG. 1.

As illustrated in FIG. 1, a detection target circuit may be positioned in a rectangle 1 indicated by a dotted line. Specifically, the detection target circuit 1 may be positioned at a power supply voltage V1 applied to the detection target circuit 1 and $R_L$ indicated as an equivalent resistance in the detection target circuit 1.

The detection target circuit 1 may include a top switch, which is disconnected from or connected to the power supply voltage V1 in order to apply the power supply voltage V1 applied to the detection target circuit 1, and a bottom switch, which is disconnected from or connected to a ground PGND.

The detection circuit according to the present disclosure includes an applied voltage source V2, a diode D1, and four resistors.

The term "top" refers to a side closer to the applied voltage source V2, and the term "bottom" refers to a side closer to the ground. Specifically, the diode D1, a first resistor R1, a second resistor R2, and a first input unit, which measures a voltage value between the first resistor R1 and the second resistor R2 may be positioned at the top of the detection circuit In the above case, since the diode D1 is positioned just below the applied voltage source V2, the power supply voltage V1 of the detection target circuit 1 may prevent a current from flowing toward the applied voltage source V2.

Next, a third resistor R3, a fourth resistor R4, and a second input unit which measures a voltage value between the third resistor R3 and the fourth resistor R4 may be positioned at the bottom of the detection circuit.

Voltage values measured in the first input unit and the second input unit may be transmitted to an electronic control unit 100 illustrated in FIG. 2, and the electronic control unit 100 may determine whether an error exists in the detection target circuit 1 based on the received voltage values.

Next, FIG. 2 is a block diagram of a circuit fault detection system including the first input unit and the second input unit of the detection circuit of FIG. 1.

Such a circuit fault detection system 1000 includes an input unit 10, the electronic control unit 100, and a display unit 400, as illustrated in FIG. 2.

The input unit 10, which includes the first input unit and the second input unit, transmits measured voltage values to the electronic control unit 100.

In addition, the input unit 10 may include a voltage value V+ measured at a contact point positioned below the top switch and a voltage value V− measured at a contact point positioned above the bottom switch as input values in order to detect a failure in an operation of the detection target circuit 1.

That is, the input unit 10 may include the voltage values measured in the first input unit, the second input unit, a V+ node, and a V− node as input values.

Next, the electronic control unit 100 collectively controls the circuit fault detection system 1000 according to the present disclosure.

Specifically, the electronic control unit 100 includes a main processor 200, which determines whether a failure exists in the detection target circuit 1 or the operation of the detection target circuit 1 based on the received voltage values, and a memory 300 which stores various types of data.

Figure 3:
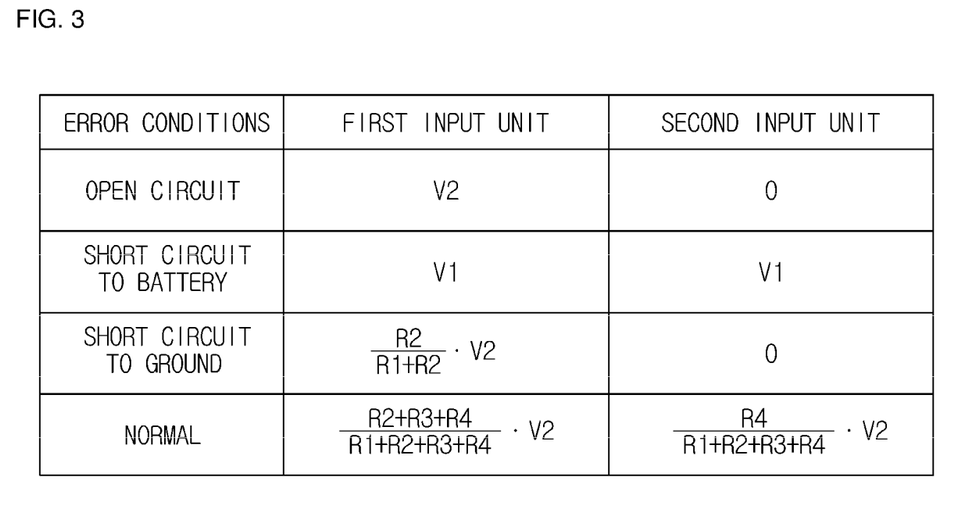
FIG. 3 is a table illustrating monitoring conditions according to one embodiment of the present disclosure.
Figure 4:
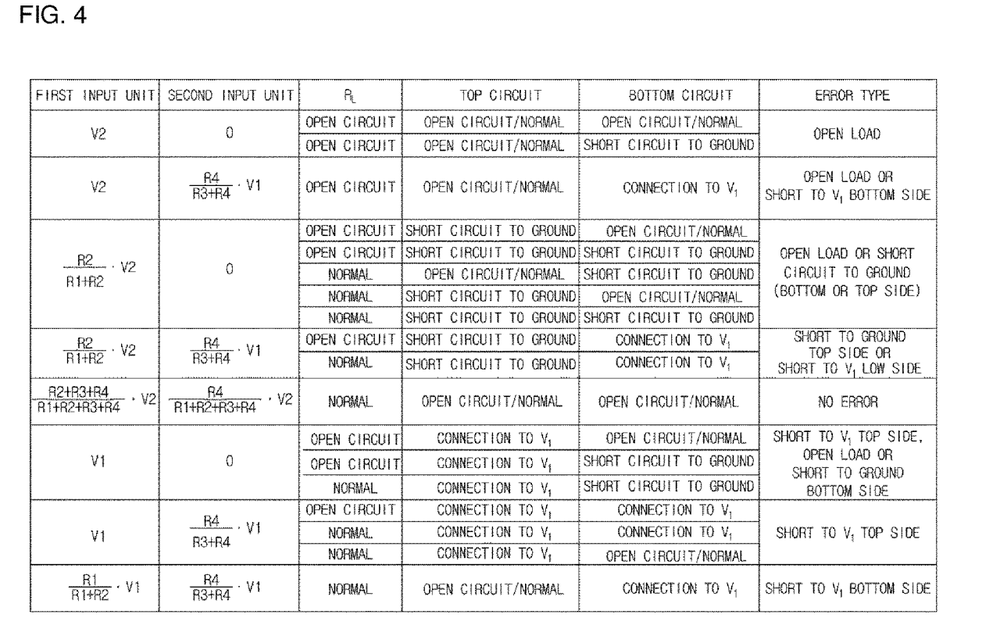
FIG. 4 is a table stored in the electronic control unit in order to detect detailed failure information in the detection target circuit

The main processor 200 determines whether a failure exists in the detection target circuit 1 or the operation of the detection target circuit 1 based on error conditions illustrated in FIGS. 3 and 4.

Next, the memory 300 stores a program and data of the circuit fault detection system 1000 according to the present disclosure.

Specifically, the memory 300 may include a volatile memory such as a static random access memory (SRAM), and a dynamic random access memory (DRAM), and a nonvolatile memory such as a flash memory, a read only memory (ROM), an erasable programmable read only memory (EPROM), and an electrically erasable programmable read only memory (EEPROM).

The nonvolatile memory may semi-permanently store a control program and control data for controlling an operation of the circuit fault detection system 1000, and the volatile memory may read the control program and the control data from the nonvolatile memory to temporarily store the read control program and the control data, and may temporarily store voltage values obtained from the input unit 10 and various types of control signals output from the main processor 200.

Therefore, the nonvolatile memory may permanently store error detection tables illustrated in FIGS. 3 and 4 in order to control the operation of the circuit fault detection system 1000.

Specifically, FIG. 3 is a table illustrating monitoring conditions according to one embodiment of the present disclosure, and FIG. 4 is a table illustrating detail error conditions according to one embodiment of the present disclosure.

First, FIG. 3 is a table stored in the electronic control unit 100 in order to detect failure information on whether an open circuit of an inside of the detection target circuit 1, a short circuit to battery, or a short circuit to ground occurs.

As illustrated in FIG. 3, the power supply voltage V1 may be connected to the detection circuit while the power supply voltage V1 is not applied in order to detect a failure in the detection target circuit 1, and in this case, whether a failure exists in the detection target circuit 1 may be determined based on voltage values measured in the first input unit and the second input unit.

For example, as illustrated in FIG. 3, in a case in which the voltage value measured in the first input unit is V2 [v] and the voltage value measured in the second input unit is 0 [v], it may be determined that an error in which the inside of the detection target circuit 1 is disconnected has occurred, that is, is opened.

In addition, for example, as illustrated in FIG. 3, in a case in which the voltage value measured in the first input unit is V1 [v] and the voltage value measured in the second input unit is the same V1 [v], it may be determined that an error in which the inside of the detection target circuit 1 is connected to a battery, which is an applied voltage, has occurred.

Further, for example, as illustrated in FIG. 3, in a case in which the voltage value measured in the first input unit is {R2/(R1+R2)}*V2 [v] and the voltage value measured in the second input unit is 0 [v], it may be determined that an error in which the inside of the detection target circuit 1 is connected to the ground has occurred.

As illustrated in FIG. 3, in a case in which the voltage value measured in the first input unit is {(R2+R3+R4)/(R1+R2+R3+R4)}*V2 [v] and the voltage value measured in the second input unit is {R4/(R1+R2+R3+R4)}*V2 [v], it may be determined that no error has occurred in the detection target circuit 1.

That is, as illustrated in FIG. 3, the main processor 200 may compare the voltage values received from the first input unit and the second input unit to the error conditions of FIG. 3 to determine which problem has occurred when an error occurs in the detection target circuit 1.

Next, FIG. 4 is a table stored in the electronic control unit 100 in order to detect detailed failure information that may occur in the detection target circuit 1.

In order to detect the detailed failure information that may occur in the detection target circuit 1, the input unit 10 includes the voltage value V+ measured at a contact point positioned below the top switch and the voltage value V− measured at a contact point positioned above the bottom switch in addition to the voltage values measured in the first input unit and the second input unit as input values.

For example, as illustrated in FIG. 4, when a voltage value measured in the first input unit is V2 [v], a voltage value measured in the second input unit is 0 [v], $R_L$ refers to equivalent resistances of the detection target circuit 1, and it is determined that the circuit is disconnected based on the voltage value V+ measured at the contact point positioned below the top switch and the voltage value V− measured at the contact point positioned above the bottom switch, the electronic control unit 100 may determine that an open circuit error such as a circuit disconnection (an open load) has occurred while the detection target circuit 1 operates regardless of whether a top or bottom circuit is disconnected or normal.

Further, for example, as illustrated in FIG. 4, when a voltage value measured in the first input unit is V2 [v], a voltage value measured in the second input unit is 0 [v], $R_L$ refers to the equivalent resistances of the detection target circuit 1, and it is determined that the circuit is disconnected based on the voltage value V+ measured at the contact point positioned below the top switch and the voltage value V− measured at the contact point positioned above the bottom, and even when it is determined that the top circuit is disconnected or normal and the bottom circuit is connected to the ground based on the measured voltage values, the electronic control unit 100 may determine that an open circuit error such as a circuit disconnection (an open load) has occurred while the detection target circuit 1 operates.

Further, for example, as illustrated in FIG. 4, when the voltage value measured in the first input unit is V2 [v], the voltage value measured in the second input unit is {R4/(R3+R4)}*V1 [v], $R_L$ refers to the equivalent resistances of the detection target circuit 1, it is determined that the circuit is disconnected based on the voltage value V+ measured at the contact point positioned below the top switch and the voltage value V− measured at the contact point positioned above the bottom switch, and it is determined that the top circuit is disconnected or normal and the voltage value measured at the bottom is V1, the electronic control unit 100 may determine that an open circuit error such as a circuit disconnection has occurred while the detection target circuit 1 operates and an error in which the bottom circuit is connected to V1, which is an applied voltage, has occurred.

Further, for example, as illustrated in FIG. 4, when the voltage value measured in the first input unit is {R2/(R1+R2)}*V2 [v], the voltage value measured in the second input unit is 0 [v], $R_L$ refers to the equivalent resistances of the detection target circuit 1, it is determined that the circuit is disconnected based on the voltage value V+ measured at the contact point positioned below the top switch and the voltage value V− measured at the contact point positioned above the bottom switch, and it is determined that the top circuit is connected to the ground and the bottom circuit is disconnected, is normal, or is connected to the ground, the electronic control unit 100 may determine that an open circuit error such as a circuit disconnection has occurred while the detection target circuit 1 operates and an error in which the top or bottom circuit is connected to the ground has occurred.

In addition, even when the voltage value measured in the first input unit is {R2/(R1+R2)}*V2 [v], the voltage value measured in the second input unit is 0 [v], $R_L$ refers to the equivalent resistances of the detection target circuit 1, it is determined that the circuit is normal based on the voltage value V+ measured at the contact point positioned below the top switch and the voltage value V− measured at the contact point positioned above the bottom switch, and it is determined that the top circuit is disconnected or normal and the bottom circuit is connected to the ground, or the top circuit is connected to the ground or the bottom circuit is disconnected, is normal, or is connected to the ground, the electronic control unit 100 may determine that an open circuit error such as a circuit disconnection has occurred while the detection target circuit 1 operates and an error in which the top or bottom circuit is connected to the ground has occurred.

Further, for example, as illustrated in FIG. 4, when the voltage value measured in the first input unit is {R2/(R1+R2)}*V2 [v], the voltage value measured in the second input unit is {R4/(R3+R4)}*V1 [v], $R_L$ refers to the equivalent resistances of the detection target circuit 1, it is determined that the circuit is disconnected or normal based on the voltage value V+ measured at the contact point positioned below the top switch and the voltage value V− measured at the contact point positioned above the bottom switch, and it is determined that the top circuit is connected to the ground and the bottom circuit is connected to V1, the electronic control unit 100 may determine that an error in which the top circuit is connected to the ground and the bottom circuit is connected to V1 has occurred.

Next, when the voltage value measured in the first input unit is {(R2+R3+R4)/(R1+R2+R3+R4)}*V2 [v], the voltage value measured in the second input unit is {R4/(R1+R2+R3+R4)}*V2 [v], $R_L$ refers to the equivalent resistances of the detection target circuit 1, it is determined that the circuit is normal based on the voltage value V+ measured at the contact point positioned below the top switch and the voltage value V− measured at the contact point positioned above the bottom switch, and it is determined that the top circuit or the bottom is disconnected or normal, the electronic control unit 100 may determine that the detection target circuit 1 operates normally.

Further, for example, as illustrated in FIG. 4, when the voltage value measured in the first input unit is V1 [v], the voltage value measured in the second input unit is 0 [v], $R_L$ refers to the equivalent resistances of the detection target circuit 1, it is determined that the circuit is disconnected based on the voltage value V+ measured at the contact point positioned below the top switch and the voltage value V− measured at the contact point positioned above the bottom switch, and it is determined that the top circuit is connected to V1 and the bottom circuit is disconnected, is normal, or is connected to the ground, the electronic control unit 100 may determine that an error in which the top circuit is connected to V1 has occurred while the detection target circuit 1 operates and an open circuit error such as a circuit disconnection has occurred or an error in which the bottom circuit is connected to the ground has occurred.

Further, for example, as illustrated in FIG. 4, when the voltage value measured in the first input unit is V1 [v], the voltage value measured in the second input unit is 0 [v], $R_L$ refers to the equivalent resistances of the detection target circuit 1, it is determined that the circuit is normal based on the voltage value V+ measured at the contact point positioned below the top switch and the voltage value V– measured at the contact point positioned above the bottom switch, and it is determined that the top circuit is connected to V1 and the bottom circuit is connected to the ground, the electronic control unit 100 may determine that an error in which the top circuit is connected to V1 or the bottom circuit is connected to the ground has occurred while the detection target circuit 1 operates.

Further, for example, as illustrated in FIG. 4, when the voltage value measured in the first input unit is V1 [v], the voltage value measured in the second input unit is {R4/(R3+R4)}*V1 [v], $R_L$ refers to the equivalent resistances of the detection target circuit 1, it is determined that the circuit is disconnected or normal based on the voltage value V+ measured at the contact point positioned below the top switch and the voltage value V– measured at the contact point positioned above the bottom switch, and it is determined that the top circuit is connected to V1 and the bottom circuit is disconnected, is normal, or is connected to V1, the electronic control unit 100 may determine that an error in which the top circuit is connected to V1 has occurred while the detection target circuit 1 operates.

Further, finally, as illustrated in FIG. 4, when the voltage value measured in the first input unit is {R1/(R1+R2)}*V1 [v], the voltage value measured in the second input unit is {R4/(R3+R4)}*V1 [v], $R_L$ refers to the equivalent resistances of the detection target circuit 1, it is determined that the circuit is normal based on the voltage value V+ measured at the contact point positioned below the top switch and the voltage value V– measured at the contact point positioned above the bottom switch, and it is determined that the top circuit is disconnected or normal and the bottom circuit is connected to V1, the electronic control unit 100 may determine that an error in which the bottom circuit is connected to V1 has occurred while the detection target circuit 1 operates.

That is, as illustrated in FIG. 4, since the errors that may occur while the detection target circuit 1 operates may be categorized and stored in the memory 300 of the electronic control unit 100, causes of faults in the detection target circuit 1 may be easily found based on the voltage values obtained from the first input unit, the second input unit, the V+ node, and the V– node.

Therefore, the electronic control unit 100 transmits the control signal to the display unit 400 so that a user may check a cause of a fault based on the obtained voltage values.

Then, the display unit 400 may display the voltage values obtained from the input unit 10 and the errors that occurred in the detection target circuit 1 so that the user may check the voltage values and the errors.

A configuration of the circuit fault detection system 1000 according to the present disclosure has been described above.

Figure 5:
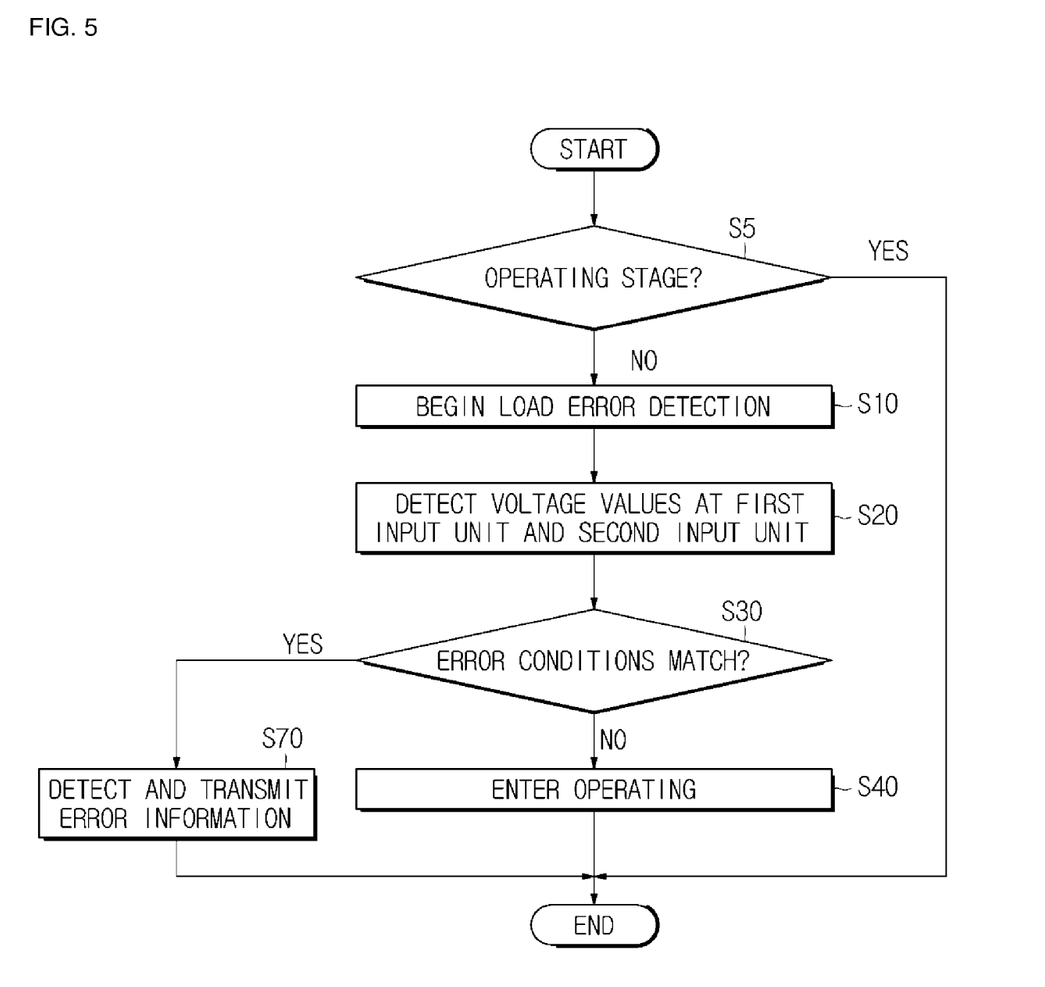
FIG. 5 is a flowchart illustrating a control method of the circuit fault detection system

Hereinafter, FIG. 5 is a flowchart illustrating a control method of the circuit fault detection system 1000 according to the present disclosure.

First, the circuit fault detection system 1000 according to the present disclosure determines whether the detection target circuit 1 is in an operating step (S5). Specifically, step S5 refers to a step of detecting errors such as an open circuit error in the detection target circuit 1, a short circuit to battery error, and a short circuit to ground error while a power supply voltage applied to the detection target circuit 1 is not applied.

In this case, when error conditions do not match ("NO" in step S5), a step of detecting a load error begins in order to detect an operating error of the detection target circuit 1 (S10).

To this end, the circuit fault detection system 1000 detects voltage values in first and second input units (S20).

In this case, when the error conditions match ("YES" in step S30), the circuit fault detection system 1000 may transmit detected error information to the display unit 400 to provide a warning to a user (S70).

When a load error is not detected, the circuit fault detection system 1000 according to the present disclosure determines that the detection target circuit 1 operates normally and allows the detection target circuit 1 to enter an operating state (S40).

As is apparent from the above description, the circuit fault detection system and method for circuit fault detection according to the embodiments can detect an error in a circuit at a low cost, such as a case in which a circuit error detection system is ensured using a circuit diagram composed only of resistors which are passive elements except for diodes.

In addition, the circuit fault detection system and method for circuit fault detection according to the embodiments can research on a control method for detecting an error in a circuit at a low cost, such as a case in which a circuit error detection system is ensured using a circuit diagram composed only of resistors which are passive elements except for diodes in order to detect a fault in a circuit, continuously progressing.

In addition, the circuit fault detection system and method for circuit fault detection according to the embodiments can determine a possibility of error occurrence by expecting data regarding possible errors in stages, and can obtain data regarding an error which has occurred.

In addition, the circuit fault detection system and method for circuit fault detection according to the embodiments can detect various malfunctions by assigning resistance values without overlapping voltage values of input nodes when conditions for possible errors are classified.

While exemplary embodiments of the present disclosure have been illustrated and described above, the present disclosure is not limited to the aforementioned specific exemplary embodiments. Those skilled in the art may variously modify the present disclosure without departing from the gist of the present disclosure claimed by the appended claims, and such modifications are within the scope of the claims.

What is claimed is:

1. A circuit fault detection system comprising:
    a detection circuit including a diode, a first resistor, a second resistor, a third resistor, and a fourth resistor, wherein
    the diode, the first resistor, and the second resistor are connected to one another in series and are located between an applied voltage source and a top of a detection target circuit, and the third resistor and the fourth resistor are connected in series and are located between the detection target circuit and a ground;

an input unit including a first input terminal configured to receive a voltage measured between the first resistor and the second resistor as an input, and a second input terminal configured to receive a voltage measured between the third resistor and the fourth resistor as an input;

a controller configured to detect a failure in the detection target circuit and in an operation of the detection target circuit based on values of the voltages detected by the input unit; and a display unit configured to provide a warning to a user when the failure is detected, wherein the first to fourth resistors of the detection circuit have values greater than equivalent resistance values of the detection target circuit.

2. The system according to claim 1, wherein the controller includes error data that occurs in at least one of the detection target circuit or the operation of the detection target circuit based on the values of the voltages detected by the input unit.

3. The system according to claim 2, wherein the controller controls the error data to be displayed to the user when a failure which matches the error data is detected.

4. The system according to claim 3, wherein a failure that occurs in the detection target circuit is one of an open circuit in the detection target circuit, a short circuit to battery, and a short circuit to ground.

5. A circuit fault detection control method, the method comprising:

in a detection circuit including a diode, a first resistor, a second resistor, a third resistor, and a fourth resistor, wherein the diode, the first resistor, and the second resistor are connected to one another in series and are located between an applied voltage source and a top of a detection target circuit, the third resistor and the fourth resistor are connected in series and are located between the detection target circuit and a ground; and wherein the first to fourth resistors of the detection circuit have values greater than equivalent resistance values of the detection target circuit;

measuring a first voltage between the first resistor and the second resistor;

measuring a second voltage between the third resistor and the fourth resistor;

detecting a failure in the detection target circuit and in an operation of the detection target circuit based on a value of the measured first voltage and a value of the measured second voltage; and providing a warning to a user when the failure is detected.

6. The method according to claim 5, wherein the failure in the detection target circuit includes an open circuit in the detection target circuit, a short circuit to battery, and a short circuit to ground.

7. The method according to claim 6, further comprising measuring a voltage value at a top of the detection target circuit and a voltage value at a bottom thereof in order to detect an error in the operation of the detection target circuit.

* * * * *